United States Patent

Schelling et al.

(10) Patent No.: US 9,525,056 B2
(45) Date of Patent: Dec. 20, 2016

(54) VERTICAL MICROELECTRONIC COMPONENT AND CORRESPONDING PRODUCTION METHOD

(71) Applicant: Robert Bosch GmbH, Stuttgart (DE)

(72) Inventors: Christoph Schelling, Stuttgart (DE); Walter Daves, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 181 days.

(21) Appl. No.: 14/028,610

(22) Filed: Sep. 17, 2013

(65) Prior Publication Data

US 2014/0084299 A1 Mar. 27, 2014

(30) Foreign Application Priority Data

Sep. 21, 2012 (DE) .................. 10 2012 217 073

(51) Int. Cl.
| | |
|---|---|
| H01L 29/778 | (2006.01) |
| H01L 29/66 | (2006.01) |
| H01L 29/423 | (2006.01) |
| H01L 29/78 | (2006.01) |
| H01L 29/16 | (2006.01) |
| H01L 29/20 | (2006.01) |

(52) U.S. Cl.
CPC ..... H01L 29/7788 (2013.01); H01L 29/42372 (2013.01); H01L 29/66462 (2013.01); H01L 29/7789 (2013.01); H01L 29/7855 (2013.01); H01L 29/1608 (2013.01); H01L 29/2003 (2013.01); H01L 2924/1033 (2013.01)

(58) Field of Classification Search
CPC ............... H01L 21/76885; H01L 29/66439; H01L 29/66446; H01L 29/66462; H01L 29/2003; H01L 29/1054; H01L 29/66431; H01L 29/0676; H01L 29/778; H01L 29/7788; H01L 29/7926; H01L 2924/1033; H01L 2924/10344
See application file for complete search history.

(56) References Cited

U.S. PATENT DOCUMENTS

| | | | |
|---|---|---|---|
| 6,818,061 B2 | 11/2004 | Peczalski et al. | |
| 8,674,341 B2 * | 3/2014 | Ko ................... | H01L 29/66818 257/24 |
| 2005/0145883 A1 * | 7/2005 | Beach ................. | H01L 29/7835 257/194 |

(Continued)

*Primary Examiner* — Tucker J Wright
*Assistant Examiner* — Stephen C Smith
(74) *Attorney, Agent, or Firm* — Maginot, Moore & Beck LLP (57) ABSTRACT

A vertical microelectronic component includes a semiconductor substrate having a front side and a back side, and a multiplicity of fins formed on the front side. Each fin has a side wall and an upper side and is separated from other fins by trenches. Each fin includes a GaN/AlGaN heterolayer region formed on the side wall and including a channel region extending essentially parallel to the side wall. Each fin includes a gate terminal region arranged above the GaN/AlGaN heterolayer region and electrically insulated from the channel region in the associated trench on the side wall. A common source terminal region arranged above the fins is connected to a first end of the channel region in a vicinity of the upper sides. A common drain terminal region arranged above the back side is connected to a second end of the channel region in a vicinity of the front side.

8 Claims, 9 Drawing Sheets

(56) References Cited

U.S. PATENT DOCUMENTS

| | | | |
|---|---|---|---|
| 2006/0057790 A1* | 3/2006 | Clarke | H01L 29/66462 438/172 |
| 2006/0099781 A1 | 5/2006 | Beaumont et al. | |
| 2009/0057684 A1* | 3/2009 | Otake | H01L 29/045 257/76 |
| 2010/0252816 A1* | 10/2010 | Ko | H01L 29/66818 257/24 |
| 2010/0283083 A1* | 11/2010 | Niiyama | H01L 29/7835 257/192 |
| 2011/0101370 A1 | 5/2011 | Cheng et al. | |
| 2011/0260216 A1* | 10/2011 | Hebert | H01L 21/8258 257/194 |

\* cited by examiner

VERTICAL MICROELECTRONIC COMPONENT AND CORRESPONDING PRODUCTION METHOD

This application claims priority under 35 U.S.C. §119 to patent application no. DE 10 2012 217 073.1, filed on Sep. 21, 2012 in Germany, the description of which is incorporated herein by reference in its entirety.

BACKGROUND

The present disclosure relates to a vertical microelectronic component and to a corresponding production method.

The HEMT transistor (high electron mobility transistor) is a particular configuration of the field-effect transistor, which is suitable in particular for use at high frequencies owing to the very small component capacitances. In terms of structure, the HEMT transistor consists of layers of various semiconductor materials with band gaps of different sizes (so-called heterostructure), for which the material system GaN/AlGaN is for example used. If these two materials are deposited on one another, a two-dimensional electron gas which can be used as a conductive channel, since the electron mobility therein is very high, is formed at the interface of these materials on both sides of the GaN.

Conventional HEMT transistors with the material system GaN/AlGaN are produced by epitaxial deposition of GaN/AlGaN heterostructures on planar or, alternatively, prestructured substrates in a continuous layer. It is possible to deposit both high epitaxial layers on monocrystalline GaN substrates and heteroepitaxial layers on sapphire, silicon carbide or silicon substrates. The most economical variant in this case is provided, in particular, by the possibility of being able to use large substrates, for example by selecting silicon.

Corresponding production methods are known for example from US 2011/0101370 A1, US 2006/0099781 A1 or U.S. Pat. No. 6,818,061 B2.

In such GaN/AlGaN heterostructures, the electron mobilities are typically more than 2000 $cm^2$/Vs and the charge carrier densities are more than $10^{13}$ $cm^{-2}$ in the channel region. These properties offer the potential of producing power transistors with extremely low conduction losses. However, these advantageous properties can be used for the aforementioned layer structure GaN/AlGaN on silicon wafers only by lateral components, which generally entails a larger area requirement in comparison with known vertical power transistors on silicon or silicon carbide. This problem is particularly relevant for high voltage classes above 600 V since, in the case of lateral components, a high voltage strength is possible only by increasing the distance between the gate and drain terminals. The performance advantages of GaN/AlGaN components over those made of silicon or silicon carbide can therefore sometimes be overcompensated for by the greater surface area used.

SUMMARY

The present disclosure provides a vertical microelectronic component according to the description below and a corresponding production method according to the description below.

Preferred refinements are the subject-matter of the description below.

The production method according to the disclosure makes it possible to apply GaN/AlGaN heterostructures onto the side walls of fins provided on a semiconductor substrate, for example a silicon semiconductor substrate, with a predetermined crystallographic orientation, for example perpendicularly to the (111) crystal surface of a silicon substrate.

By means of the proposed combination of etching and deposition processes, it is possible to produce a vertical GaN/AlGaN transistor structure with a frontside source terminal and a backside drain terminal.

The proposed vertical transistor structure has the advantage that the distance between the gate terminal and the drain terminal can be adjusted freely by the thickness of a dielectric layer lying between them, and a high voltage strength can therefore be achieved without increasing the surface area used. The transistor structure according to the disclosure therefore permits less use of surface area and a higher power density in comparison with known lateral transistor structures.

The disclosure permits an arbitrarily selectable growth surface for the heterostructure, which is defined merely by the etching trenches in the silicon substrate. As a result, optimum crystal growth conditions can be set. Besides the lower area requirement in comparison with conventional lateral transistor structures, the transistor structure according to the disclosure also has a lower resistivity, particularly in high voltage classes above 600 V. Furthermore, a lower thermal resistance can be achieved by virtue of the vertical transistor structure with a thinned Si or SOI substrate.

According to a preferred embodiment, each fin has two GaN/AlGaN heterolayer regions, which are formed on opposite sides of the side wall and which have a respective embedded channel region that extends essentially parallel to the side wall, and two gate terminal regions, which are arranged above the two GaN/AlGaN heterolayer regions while being electrically insulated from the channel region in the associated trench on the side wall. This has the advantage of particularly favorable utilization of the available space.

According to another preferred embodiment, the gate terminal regions are electrically connected via respective gate lines in parallel trenches and the gate lines are electrically connected together at a common gate terminal. In this way, a common gate terminal can be formed in a simple and space-saving way.

According to another preferred embodiment, a gate insulation layer is arranged between a respective gate terminal region and the associated GaN/AlGaN heterolayer region. This ensures improved insulation and a reduction of the leakage current in the off state.

According to another preferred embodiment, the back side has further trenches, in which the common drain terminal region is connected to the respective second end of the channel region. In this way, the second ends of the channel regions can be contacted together.

BRIEF DESCRIPTION OF THE DRAWINGS

The present disclosure will be explained in more detail below with the aid of the exemplary embodiments indicated in the schematic figures of the drawings, in which.

DETAILED DESCRIPTION

In the figures, references which are the same denote elements which are the same or have the same function.

Figure 1A:
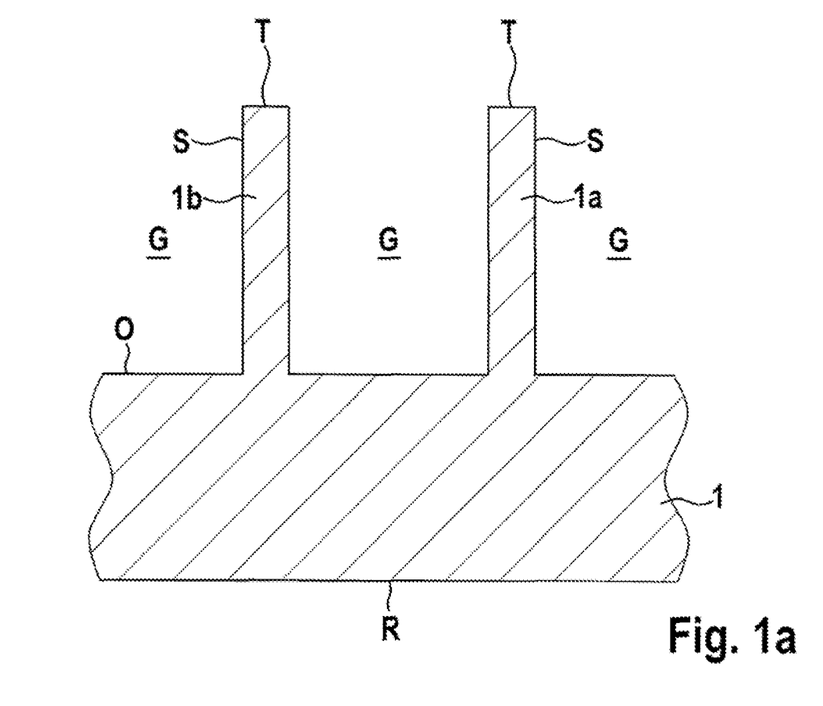
FIGS. 1a)-o) show schematic cross-sectional representations to explain a vertical microelectronic component and a corresponding production method according to one embodiment of the present disclosure.

FIGS. 1a)-o) are schematic cross-sectional representations to explain a vertical microelectronic component and a corresponding production method according to one embodiment of the present disclosure.

In FIG. 1a), reference 1 denotes a silicon semiconductor substrate, which has a front side O and a back side R. By a trench etching process, a multiplicity of fins 1a, 1b, between which there are trenches G in the silicon semiconductor substrate 1, are formed on the front side O of the silicon semiconductor substrate 1. In the present example, the etched trenches G are selected in such a way that they are introduced into the silicon semiconductor substrate 1 perpendicularly to the (111) crystal surface. The side walls of the fins 1a, 1b are denoted by references S and their upper sides by references T. The arrangement of the fins 1a, 1b may be one-dimensional (for example linear), but also two-dimensional (cf. FIG. 2).

Figure 1B:
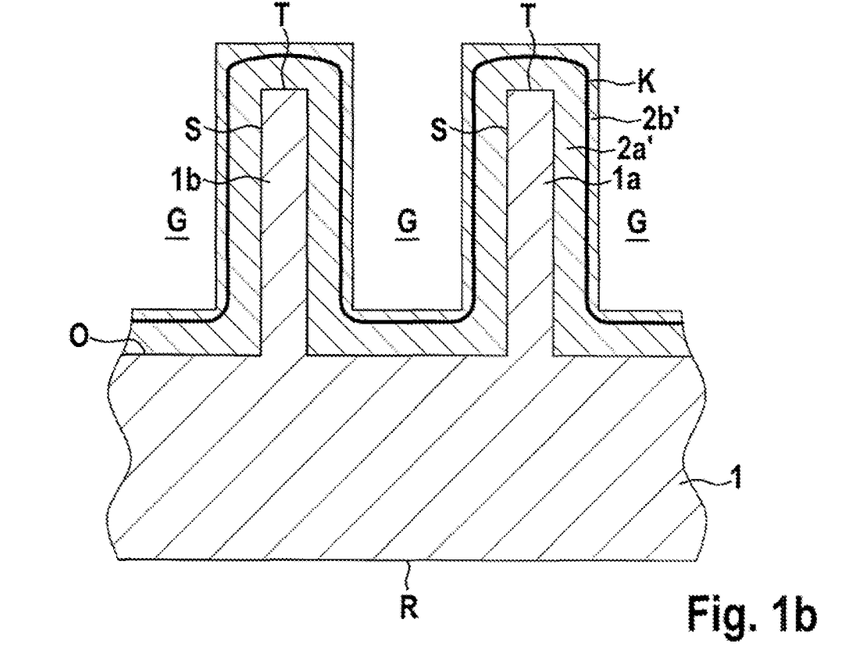

Furthermore, with reference to FIG. 1b), a deposition process is carried out, for example by means of metalorganic vapor phase epitaxy (MOVPE), of a GaN/AlGaN heterolayer system 2a', 2b' on the front side O of the silicon semiconductor substrate, so that the GaN/AlGaN heterolayer system 2a', 2b' extends over the front side O through the trenches G over the fins 1a, 1b along the side walls S and upper sides T. A channel region K having an electron gas in this case lies in the GaN/AlGaN heterolayer system 2a', 2b'.

Figure 1C:
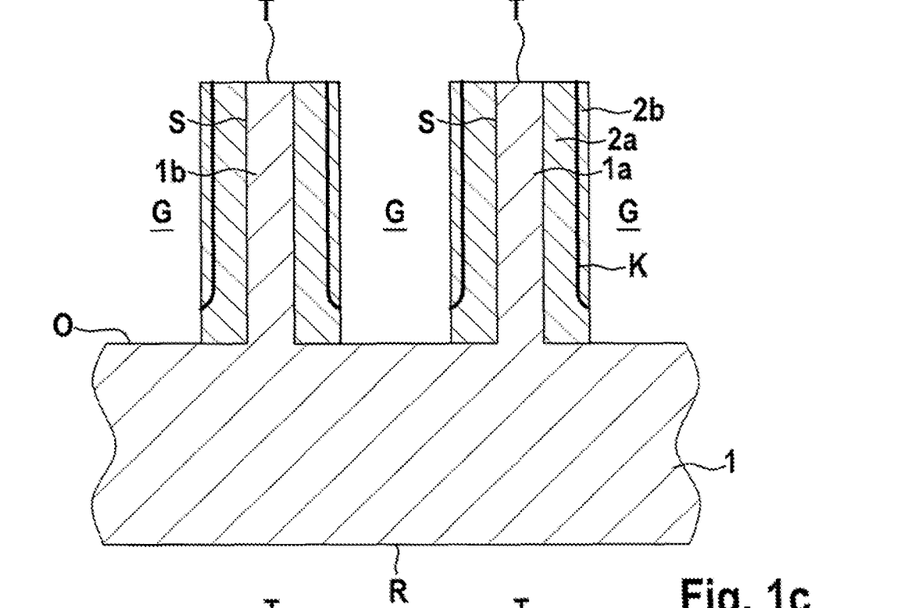

As represented in FIG. 1c), an anisotropic etching process is subsequently carried out, for example by means of reactive ion etching, in order to remove the GaN/AlGaN heterolayer system 2a', 2b' with the channel region K from the horizontal surfaces in FIG. 1b), that is to say from the front side O of the silicon semiconductor substrate 1 and from the upper side T of the fins 1a, 1b, so that the GaN/AlGaN heterolayer system 2a', 2b' with the channel region K merely remains as a respective GaN/AlGaN heterolayer region 2a', 2b' on the side walls S of the fins 1a, 1b. The channel region K is thereby exposed in the vicinity of the front side O of the silicon semiconductor substrate 1 and in the vicinity of the upper side T of the fins 1a, 1b.

Figure 1D:
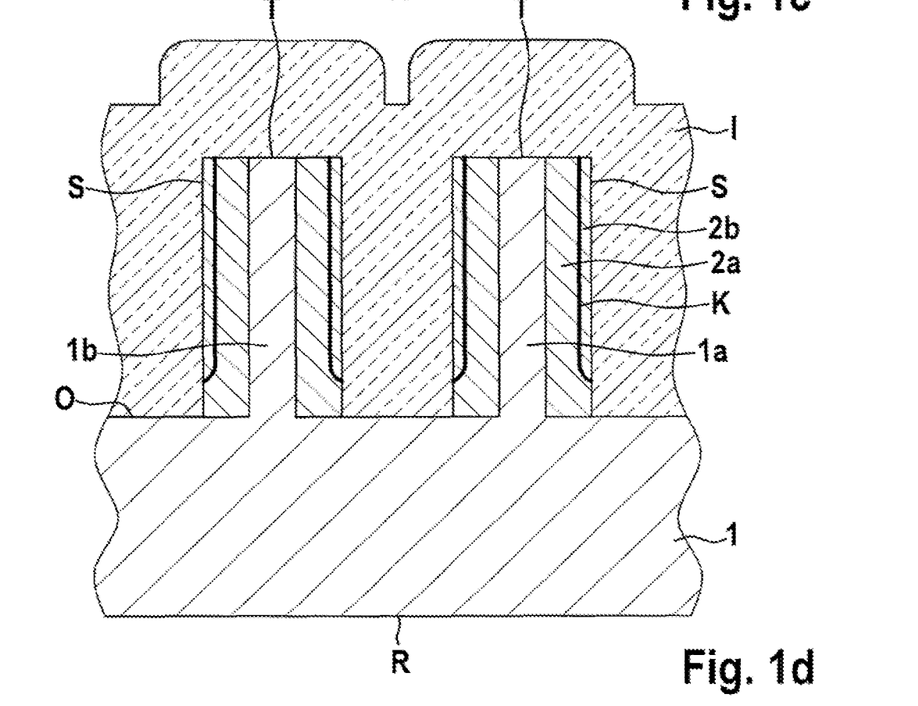
Figure 1E:
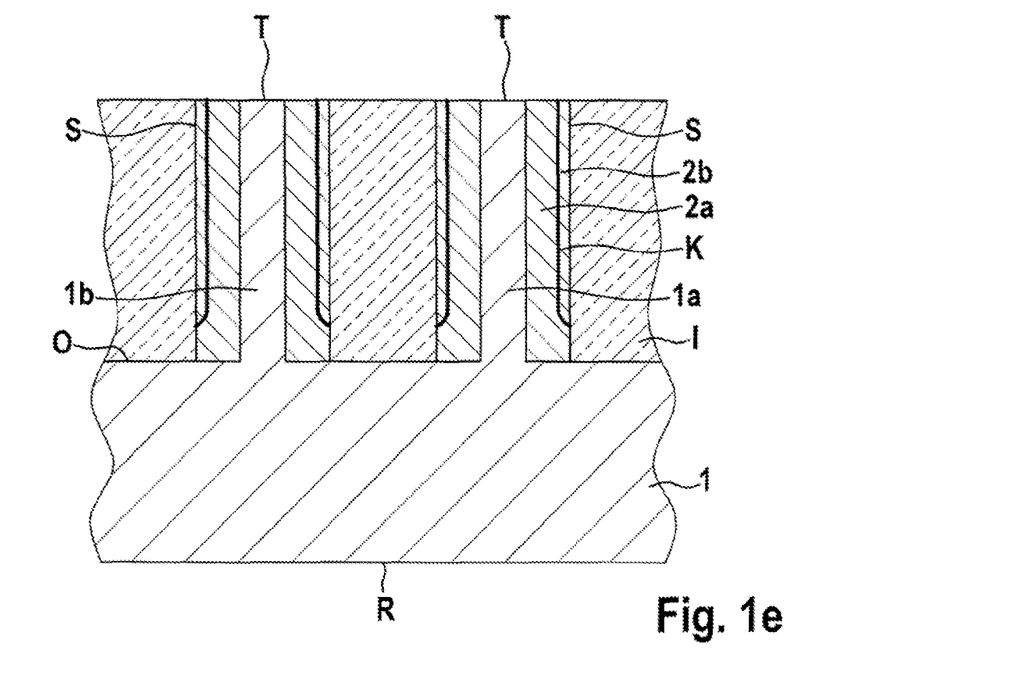

In another process step, which is illustrated in FIG. 1d), an insulation layer I, for example an oxide layer or a nitride layer, is deposited over the structure according to FIG. 1c) and is subsequently polished back, as shown in FIG. 1e), as far as the upper side T of the fins 1a, 1b.

Figure 1F:
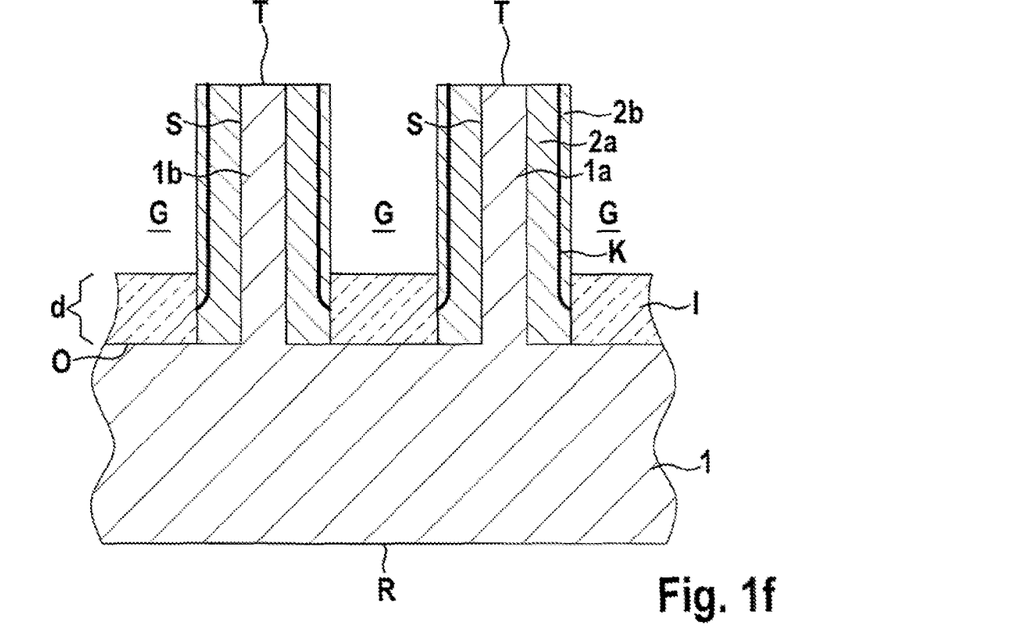

In a subsequent process step, which is illustrated in FIG. 1f), the insulation layer I is etched back between the fins 1a, 1b, so that the insulation layer I is brought to a reduced height d in the trenches G lying between them, which height is selected in such a way that the channel region K remains closed by the insulation layer I in the vicinity of the front side O of the silicon semiconductor substrate 1. This etching step may for example be carried out over the surface by a selective etching method, so that no additional photolithographic level is required.

Figure 1G:
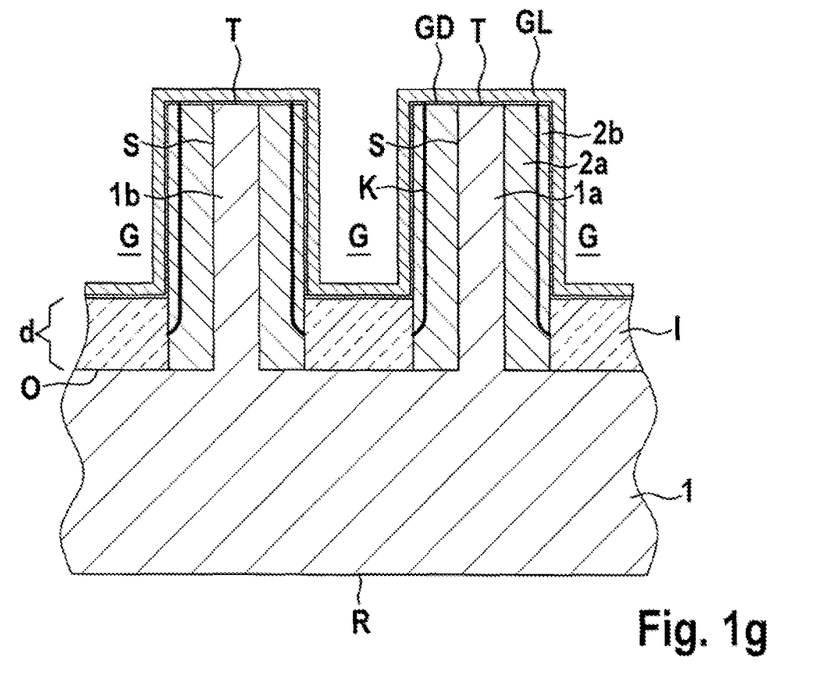

Furthermore, with reference to FIG. 1g), an optional, not categorically necessary gate insulation layer GD for better insulation is deposited over the structure of FIG. 1f), and subsequently a gate terminal layer GL thereon, for example a correspondingly doped polysilicon layer which is formed by means of low-pressure chemical vapor deposition (LP-CVD). The conformal deposition of the gate insulation layer GD may, for example, be carried out by atomic layer deposition (ALD).

Figure 1H:
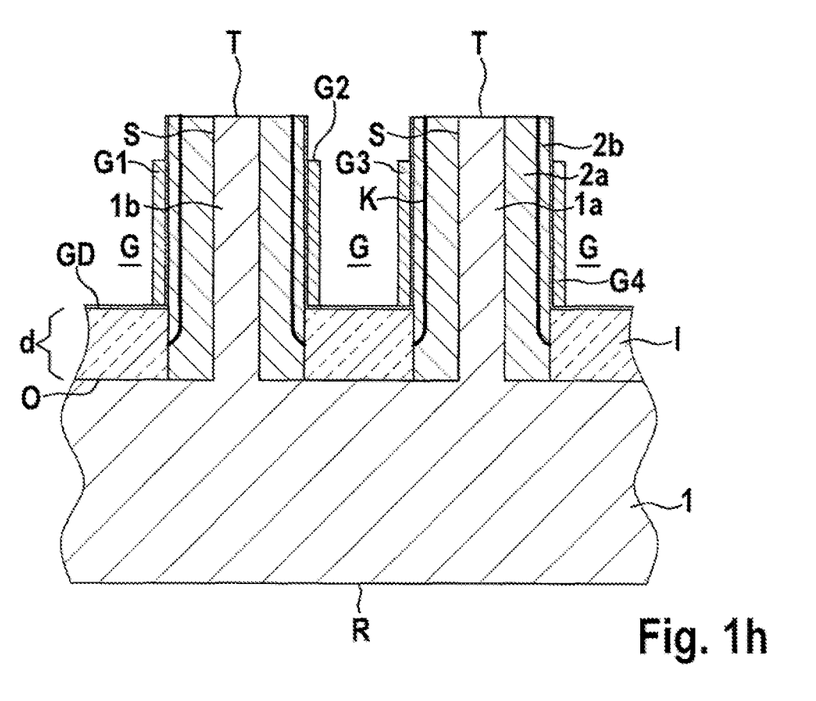

In the subsequent process step, which is shown in FIG. 1h), the gate terminal layer GL is etched back in an anisotropic etching step in such a way that it remains merely on the side walls S of the fins 1a, 1b above the respective GaN/AlGaN heterolayer region 2a, 2b and the gate insulation layer GD, which results in the formation of gate terminal regions G1, G2, G3, G4.

Figure 1I:
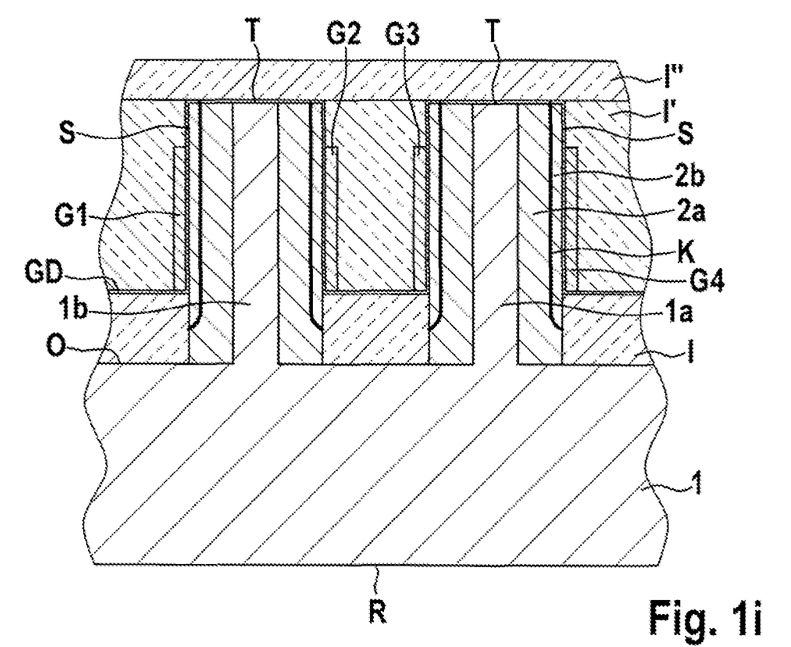

As represented in FIG. 1i), a further insulation layer I', I", which has a first, lower region I' that fills the trenches G between the fins 1a, 1b, and which has a second, upper region I" that covers the upper side T of the fins 1a, 1b, is deposited over the structure of FIG. 1h) and is polished back.

Figure 1J:
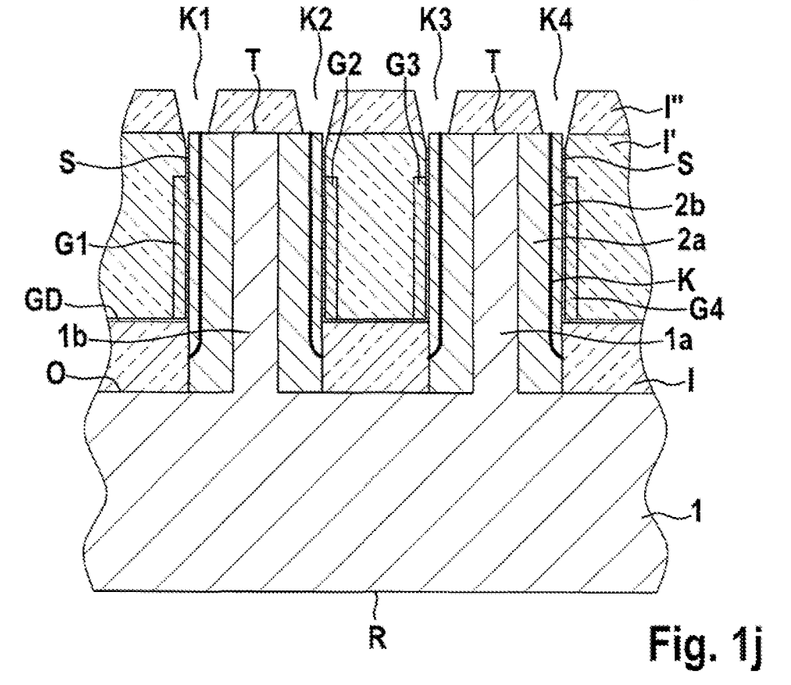

Furthermore, with reference to FIG. 1j), contact holes K1, K2, K3, K4 which respectively expose the channel region K in the vicinity of the upper side T of the fins 1a, 1b, laterally offset thereto, are formed in the second upper region I" of the further insulation layer I', I".

Figure 1K:
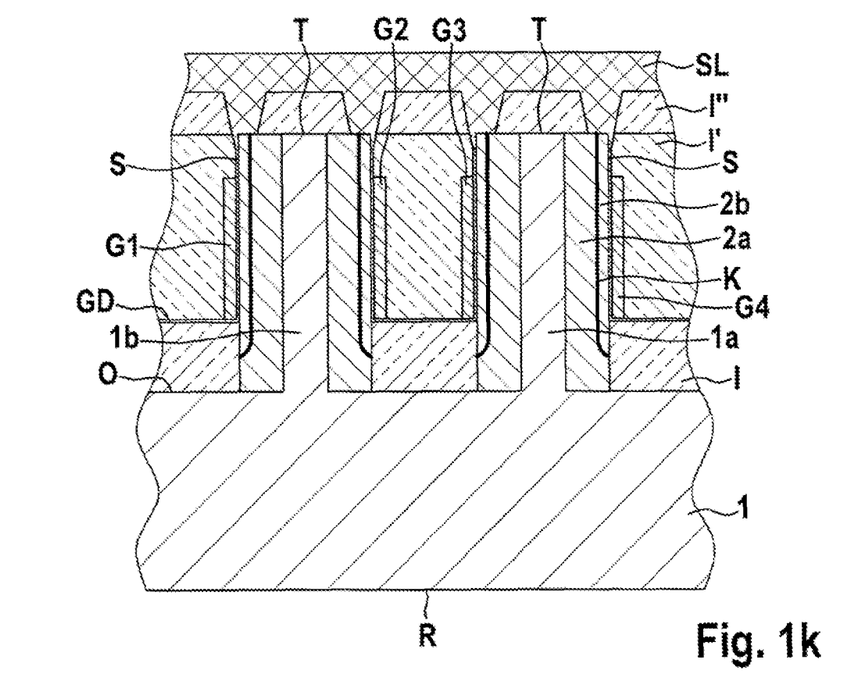

In a subsequent process step, which is shown in FIG. 1k), a common source region SL is deposited above the second, upper region I" of the further insulation layer I', I" and is structured, and brought into electrical connection respectively with the channel region K on the two sides of the fins 1a, 1b via the contact holes K1, K2, K3, K4.

Figure 1L:
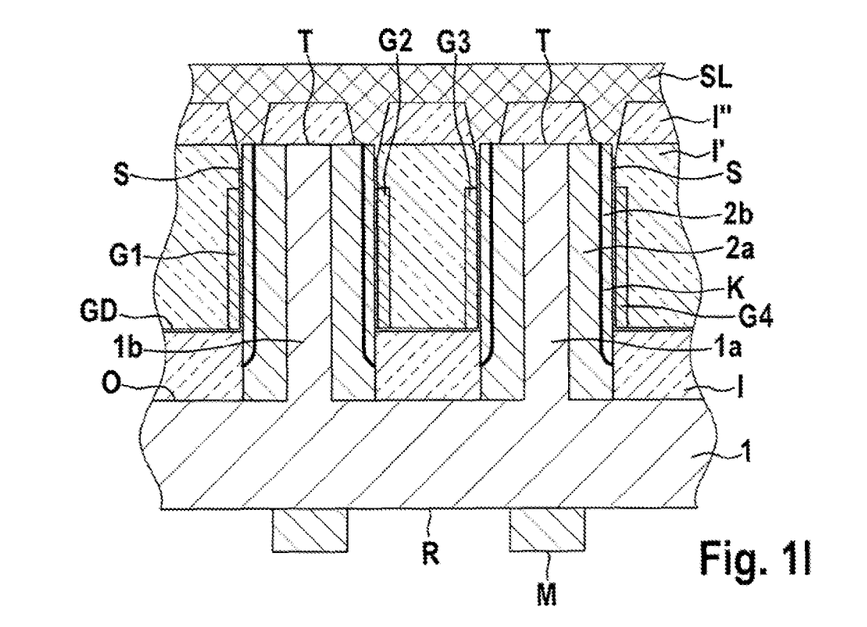

Furthermore, with reference to FIG. 1l), optional thinning back of the back side R of the silicon semiconductor substrate 1 is carried out. Subsequently, an etching mask M, for example of silicon nitride, is applied on the back side R of the silicon semiconductor substrate 1, a respective mask region being arranged opposite an associated fin 1a, 1b and occupying a somewhat larger cross-sectional area than the associated fin 1a, 1b.

According to FIG. 1m), backside trenches G' are subsequently introduced by a corresponding trench etching process, the mask regions of the etching mask M determining the width of the trenches G'. The trench etching process stops on the insulation layer I and on the respective GaN/AlGaN heterolayer region 2a, 2b. Subsequently, a dielectric layer IR, which consists for example of silicon nitride, is deposited on the back side comprising the trenches G'.

Figure 1M:
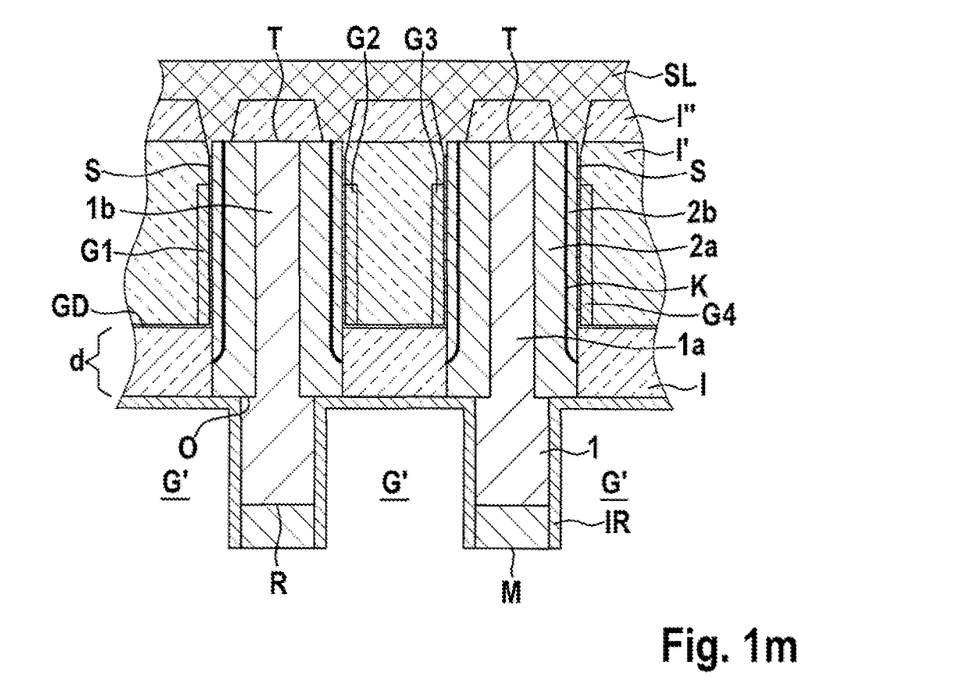
Figure 1N:
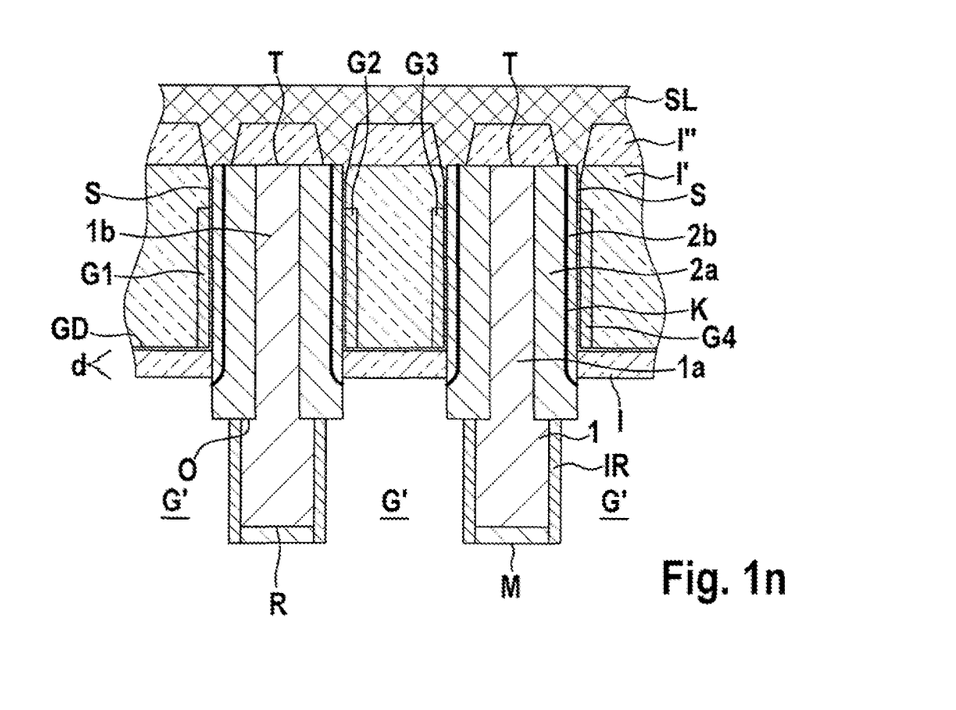

As represented in FIG. 1n), a further anisotropic etching process is then carried out, in order to remove the dielectric layer IR on the back side R on the horizontal surfaces in FIG. 1m), so that it then remains only on the vertical surfaces of the silicon semiconductor substrate 1, the insulation layer I also being etched back to a reduced thickness dr in this anisotropic etching process, and the reduced thickness dr being selected in such a way that the channel region K is then exposed in the vicinity of the front side O of the silicon semiconductor substrate at the lower end of the side walls S, that is to say on the side which lies opposite the electrical connection to the source terminal SL.

Figure 1O:
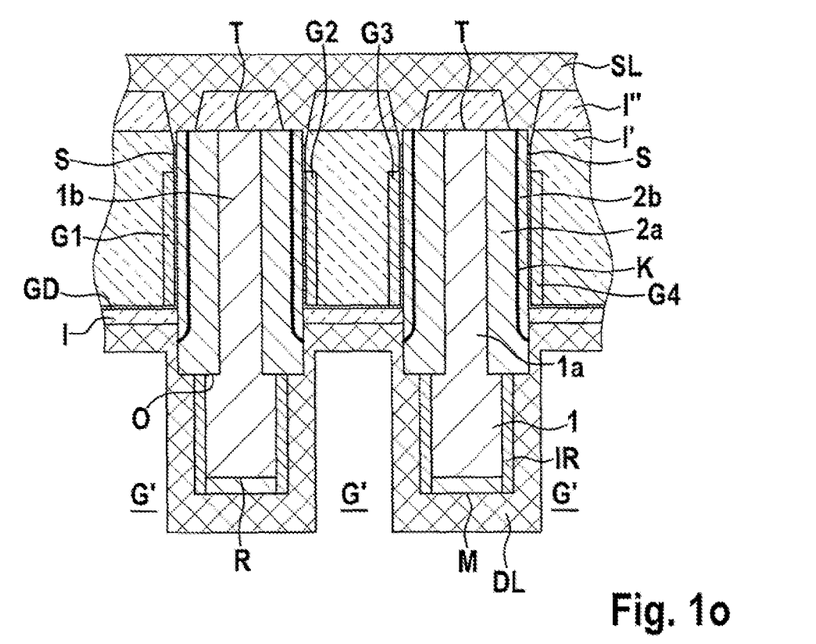

Finally, as shown in FIG. 1o), a deposition process is carried out in order to deposit and structure a drain terminal region DL, which extends essentially parallel to the source terminal region SL on the upper side T of the fins 1a, 1b.

An arrangement of four vertical HEMT transistors, which can be individually driven selectively, is therefore established, with two HEMT transistors respectively sharing one of the fins 1a, 1b.

Figure 2:
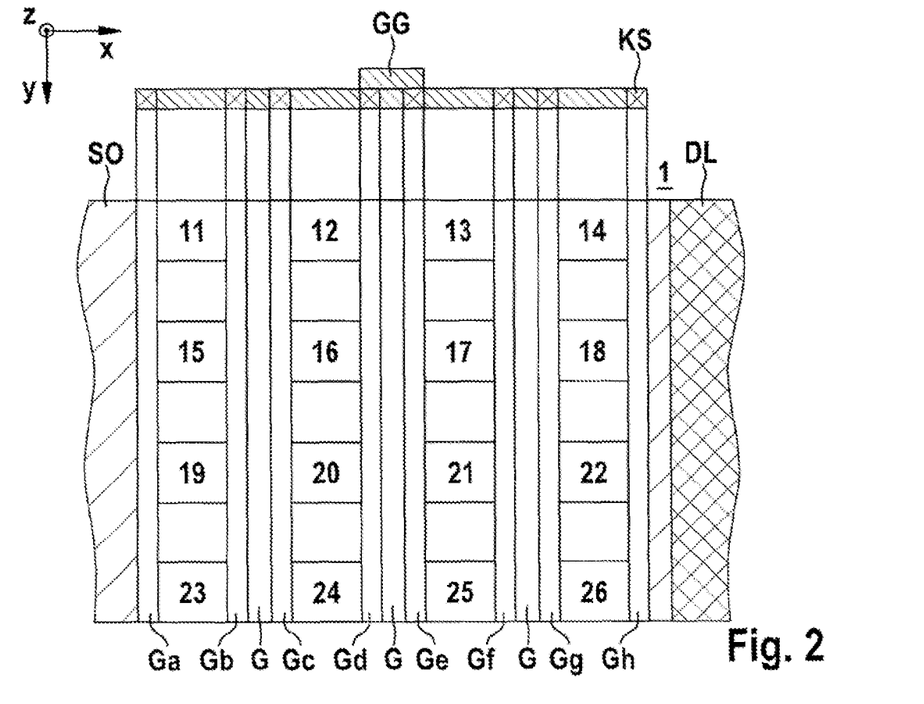
FIG. 2 shows a schematic representation of a two-dimensional arrangement of the vertical microelectronic components according to FIG. 1o)

FIG. 2 is a schematic representation of a two-dimensional arrangement of the vertical microelectronic components according to FIG. 1o).

In FIG. 2, references 11-26 denote vertical GaN/AlGaN transistor elements having fins according to FIG. 1o), each fin having two GaN/AlGaN heterolayer regions which are formed on opposite sides of the side wall and which have a respective embedded channel region that extends essentially parallel to the side wall, and two gate terminal regions, which are arranged above the two GaN/AlGaN heterolayer regions while being electrically insulated from the channel region in the associated trench on the side wall. The vertical GaN/AlGaN transistor elements 11-26 are in a two-dimensional matrix-like arrangement, which is connected together as a vertical microelectronic component.

To this end, a common source terminal region SL is arranged above the fins of the vertical GaN/AlGaN transistor elements 11-26 and connected to a respective first end of the channel region in the vicinity of the upper side of the fins, as represented in FIG. 1*o*).

Furthermore, a common drain terminal region DL is arranged above the back side and is connected to a respective second end of the channel region in the vicinity of the front side of the semiconductor substrate, as represented in FIG. 1*0*).

The gate terminal regions G1-G4 according to FIG. 1*o*) are electrically connected via respective gate lines Ga-Gi in parallel trenches G, and the gate lines Ga-Gi are electrically connected together at a common gate terminal GG via contact points KS.

Figure 3:
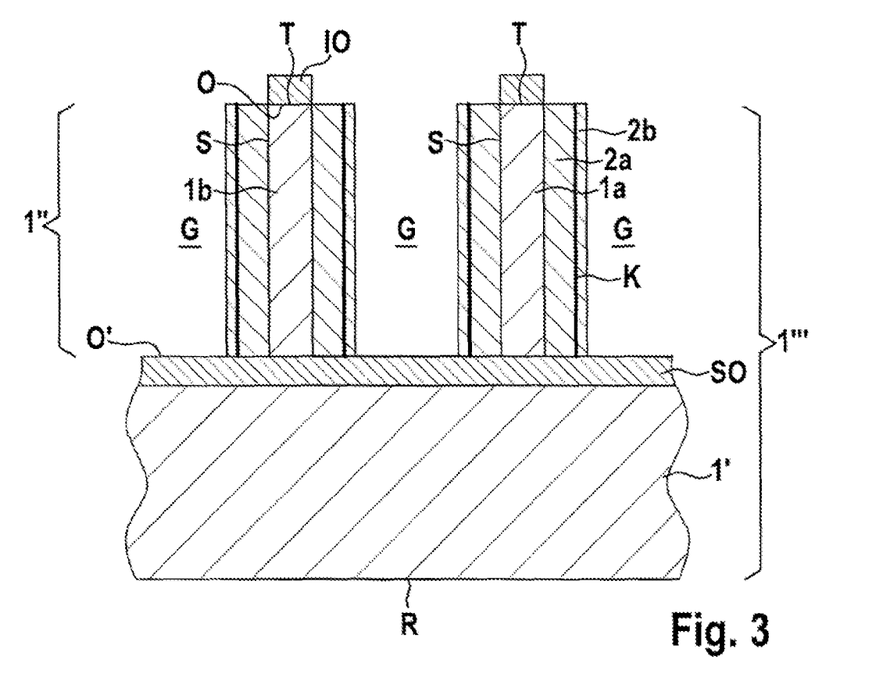
FIG. 3 shows a schematic representation of a process stage of a production method of a vertical microelectronic component according to another embodiment of the present disclosure.

FIG. 3 is a schematic representation of a process stage of a production method of a vertical microelectronic component according to another embodiment of the present disclosure.

In the embodiment shown in FIG. 3, instead of the silicon semiconductor substrate 1, an SOI substrate 1''' is used, which has a silicon wafer substrate 1', an oxide layer SO lying thereon, which has a front side O', and a further silicon wafer substrate 1'' lying thereon. FIG. 3 shows a process stage which corresponds to that of FIG. 1*c*), a respective insulation region IO additionally being deposited as masking on the upper side T of the fins 1*a*, 1*b*.

The difference from the first embodiment in this case is the possibility of selective deposition of the GaN/AlGaN heterostructure 2*a*, 2*b* on the side walls of the fins 1*a*, 1*b* by means of metalorganic vapor phase epitaxy, since the epitaxial growth takes place only on the exposed Si side walls.

The further process steps are carried out similarly as described above with reference to FIGS. 1*d*) to 1*o*).

Although the present disclosure has been fully described above with the aid of preferred exemplary embodiments, it is not restricted thereto but may be modified in a variety of ways.

In particular, the materials and methods indicated are provided only by way of example and without restriction. Also, for example, the number, arrangement and configuration of the fins may be selected arbitrarily.

What is claimed is:

1. A vertical microelectronic component, comprising:
   a semiconductor substrate including a front side and a back side;
   an arrangement of a multiplicity of fins formed on the front side of the semiconductor substrate, each respective fin of the multiplicity of fins having a first side wall and an upper side and each respective fin separated from other fins by trenches;
   a first GaN/AlGaN heterolayer region formed on the first side wall of each respective fin and defining a first embedded channel region extending essentially parallel to the first side wall of the respective fin, the first embedded channel region including a first end portion and a second opposite end portion;
   a first gate terminal region arranged on each respective fin on a side of the first GaN/AlGaN heterolayer region opposite the respective fin and electrically insulated from the first channel region;
   a common source terminal region arranged above the multiplicity of fins and directly connected to the first end portion of the first embedded channel region in a vicinity of the upper sides of the multiplicity of fins; and
   a common drain terminal region directly connected to the second end portion of the first embedded channel region.

2. The vertical microelectronic component according to claim 1, further comprising:
   a second GaN/AlGaN heterolayer region formed on each respective fin on an opposite side of the respective fin relative to the first GaN/AlGaN heterolayer region, the second GaN/AlGaN heterolayer region defining a second embedded channel region extending essentially parallel to a second side wall of the respective fin, and
   a second gate terminal region arranged on each respective fin on a side of the second GaN/AlGaN heterolayer region opposite the respective fin and electrically insulated from the second channel region.

3. The vertical microelectronic component according to claim 1, wherein:
   the first and second gate terminal regions of the multiplicity of fins are electrically connected via respective gate lines in parallel trenches, and
   the gate lines are electrically connected together at a common gate terminal.

4. The vertical microelectronic component according to claim 1, further comprising a gate insulation layer arranged between the first gate terminal region and the first GaN/AlGaN heterolayer region of each respective fin.

5. The vertical microelectronic component according to claim 1, wherein:
   the back side defines further trenches,
   and the common drain terminal region is connected to the second end of the channel region of each respective fin in the further trenches.

6. The vertical microelectronic component according to claim 1, wherein the common drain terminal region is arranged partially above the front side of the semiconductor substrate and partially below the back side of the semiconductor substrate.

7. The vertical microelectronic component according to claim 1, wherein the common drain terminal region is directly connected to the second end portion of the first embedded channel region at a location above the front side of the semiconductor substrate.

8. The vertical microelectronic component according to claim 1, wherein the common source terminal region is directly connected to the first end portion of the first embedded channel region at the upper side of the multiplicity of fins.

* * * * *